United States Patent
Guo

(10) Patent No.: US 10,453,515 B2
(45) Date of Patent: Oct. 22, 2019

(54) METHODS OF OPERATION FOR CROSS-POINT THYRISTOR MEMORY CELLS WITH ASSIST GATES

(71) Applicant: TC Lab, Inc., Gilroy, CA (US)

(72) Inventor: Frank Guo, Danville, CA (US)

(73) Assignee: TC Lab, Inc., Gilroy, CA (US)

( * ) Notice: Subject to any disclaimer, the term of this patent is extended or adjusted under 35 U.S.C. 154(b) by 0 days.

(21) Appl. No.: 15/976,706

(22) Filed: May 10, 2018

(65) Prior Publication Data
US 2018/0330772 A1 Nov. 15, 2018

Related U.S. Application Data

(60) Provisional application No. 62/504,475, filed on May 10, 2017.

(51) Int. Cl.
G11C 11/39 (2006.01)
G11C 5/14 (2006.01)

(52) U.S. Cl.
CPC .......... *G11C 11/39* (2013.01); *G11C 5/14* (2013.01)

(58) Field of Classification Search
CPC ................................. G11C 11/39; G11C 5/14
USPC .................................................. 365/180, 227
See application file for complete search history.

(56) References Cited

U.S. PATENT DOCUMENTS

| 3,967,308 | A | * | 6/1976 | Yatsuo | H01L 29/08 257/123 |
| 3,978,514 | A | * | 8/1976 | Ogawa | H01L 29/7416 257/121 |
| 4,581,626 | A | * | 4/1986 | Krishna | H01L 29/0804 257/152 |
| 7,460,395 | B1 | * | 12/2008 | Cho | G11C 11/39 365/159 |
| 9,384,814 | B2 | | 7/2016 | Gupta | |
| 9,449,669 | B2 | * | 9/2016 | Luan | G11C 11/39 |
| 9,741,413 | B2 | * | 8/2017 | Luan | H01L 21/8249 |
| 9,837,418 | B2 | * | 12/2017 | Luan | H01L 27/1027 |
| 2003/0058592 | A1 | * | 3/2003 | Hung | H01L 27/0262 361/56 |
| 2007/0189067 | A1 | * | 8/2007 | Goodwin | G11C 11/39 365/180 |
| 2009/0316492 | A1 | * | 12/2009 | Widjaja | G11C 11/404 365/189.2 |
| 2012/0131424 | A1 | * | 5/2012 | Xu | G11C 5/005 714/797 |
| 2012/0228629 | A1 | * | 9/2012 | Nemati | H01L 27/0817 257/77 |
| 2012/0314483 | A1 | * | 12/2012 | Tsukada | G11C 11/403 365/149 |
| 2014/0003140 | A1 | * | 1/2014 | Gupta | B82Y 10/00 365/180 |
| 2015/0070983 | A1 | * | 3/2015 | Kumura | G11C 7/12 365/158 |

(Continued)

*Primary Examiner* — Michael T Tran
(74) *Attorney, Agent, or Firm* — Aka Chan LLP

(57) ABSTRACT

This invention relates to thyristor memory cells with MOS assist gates for enhanced operations. This invention solves various disturb problems in cross point memory array using the thyristor memory cells, including the techniques for protecting stored data inside unselected and half selected bit cells, for recovering weakened stored data in disturbed bit cells, and for effectively shutting off bit cells with minimum disturbance.

13 Claims, 6 Drawing Sheets

(56) References Cited

U.S. PATENT DOCUMENTS

| | | | |
|---|---|---|---|
| 2015/0333068 A1* | 11/2015 | Toh | H01L 27/1027 257/107 |
| 2016/0057841 A1* | 2/2016 | Lenig | H05B 37/0281 315/291 |
| 2016/0093356 A1* | 3/2016 | Luan | G11C 11/39 365/180 |
| 2016/0093369 A1* | 3/2016 | Luan | G11C 11/418 365/156 |
| 2016/0093624 A1* | 3/2016 | Luan | H01L 27/1027 257/133 |
| 2016/0240228 A1* | 8/2016 | Bill | G11C 5/06 |
| 2016/0329094 A1* | 11/2016 | Luan | H01L 21/8249 |
| 2017/0053714 A1* | 2/2017 | Guy | G11C 11/40626 |
| 2017/0170746 A1* | 6/2017 | Benabdelaziz | H02M 1/32 |
| 2018/0020517 A1* | 1/2018 | Lou | H05B 33/0809 |
| 2018/0102159 A1* | 4/2018 | Ong | G11C 15/04 |

* cited by examiner

METHODS OF OPERATION FOR CROSS-POINT THYRISTOR MEMORY CELLS WITH ASSIST GATES

CROSS-REFERENCE TO RELATED APPLICATIONS

This patent application claims the benefit of U.S. Provisional Patent Application No. 62/504,475, filed May 10, 2017, which is incorporated by reference along with all other references cited in this application.

BACKGROUND OF THE INVENTION

This invention is related to methods for operating integrated circuit arrays of cross-point thyristor memory cells with MOS assist gates. In a general integrated circuit memory array, each memory cell, sometimes called bit cells, in an integrated circuit array holds, or stores, a bit of data, either a logic "1" or logic "0." Data is retrieved from the memory cells of the array in a read operation and inserted into the memory cells for storage in a write operation.

The memory cells of an array are packed together on a semiconductor substrate which may cause problems in the read and write operations. In cross-point memory arrays of thyristor memory cells there are various disturbance problems, including the loss or corruption of data stored within unselected and half-selected bit cells. During write operations, the data in memory cells which are connected to a cell selected for read or write operations may be corrupted, sometimes termed as "disturbs" in the semiconductor technology field. That is, the data in the memory cells connected to the word line of the selected cell and/or the memory cells connected to the bit line of the selected cell might be disturbed by write operations performed on the selected memory cell such that the integrity of the stored data is compromised.

This invention is related to methods of operation for controlling the disturbances in the cross-point thyristor memory cell array to preserve the integrity of the stored data. The invention provides for the methods of carrying out operations and avoiding data disturbance in the thyristor memory cell array, including effective techniques for writing "1" into the array and for recovering "0" stored in the array to minimize the effects of disturbance.

BRIEF SUMMARY OF THE INVENTION

This invention provides for a method of operating an array of thyristor memory cells, each thyristor memory cell having an anode, a cathode, first and second base regions. The array has a plurality of first lines in a first direction, each first line connected to the anodes or cathodes of a plurality of thyristor memory cell aligned in the first direction, a plurality of second lines in a second direction perpendicular to the first direction, each second line connected to the cathodes or anodes of thyristor memory cells aligned in the second direction, and a plurality of third lines in the first direction, each third line capacitively coupled to one of the base regions of thyristor memory cells aligned in the first direction. The method comprises: in a standby mode, holding the plurality of first lines at a first voltage and holding the plurality of second lines at a second voltage, the difference in voltage between the first and second voltages sufficient to maintain ON thyristor memory cells in that state but insufficient to turn on OFF thyristor memory cells; and for a write operation engaging one or more thyristor memory cells by a selected first line and one or more selected second lines, driving a subset of first lines connected to thyristor memory cells which are adjacent to the thyristor memory cells connected to the selected first line to a third voltage, the third voltage creating a greater difference with respect to the second voltage than the first voltage so that ON thyristor memory cells connected to the subset of first lines are undisturbed by the write operation.

This invention also provides for a method of operating an array of thyristor memory cells, each thyristor memory cell having an anode, a cathode, first and second base regions. The array has a plurality of first lines in a first direction, each first line connected anodes or cathodes of a plurality of thyristor memory cell aligned in the first direction, a plurality of second lines in a second direction perpendicular to the first direction, each second line connected to cathodes or anodes of thyristor memory cells aligned in the second direction, and a plurality of third lines in the first direction, each third line capacitively coupled to one of base regions of thyristor memory cells aligned in the first direction. The method comprises: turning ON a first set of one or more selected thyristor memory cells and/or turning OFF a second set of one or more selected thyristor memory cells, the selected thyristor memory cells connected to a selected first line and the first and second sets of selected one or more thyristor memory cells connected to one or more selected second lines; then driving all the second lines to a second voltage, driving the selected first line to a first voltage and allowing the second lines to float, and driving a selected third line capacitively coupled to the thyristor memory cells connected to the selected first line to a third voltage, a difference between the third and second voltages sufficient to maintain ON thyristor memory cells connected to the selected first line in ON states but insufficient to turn ON the OFF thyristor memory cells connected to the selected first line and a difference between the first and second voltages sufficient to drive the ON thyristor memory cells into deeper ON states with the third voltage on the selected third line. The method further comprises: driving a subset of first lines connected to thyristor memory cells which are adjacent to the thyristor memory cells connected to the selected first line to a fourth voltage, the fourth voltage creating a greater difference with respect to the second voltage than the first voltage so that ON thyristor memory cells connected to the subset of first lines are undisturbed by the performance of the recover operation.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1A:
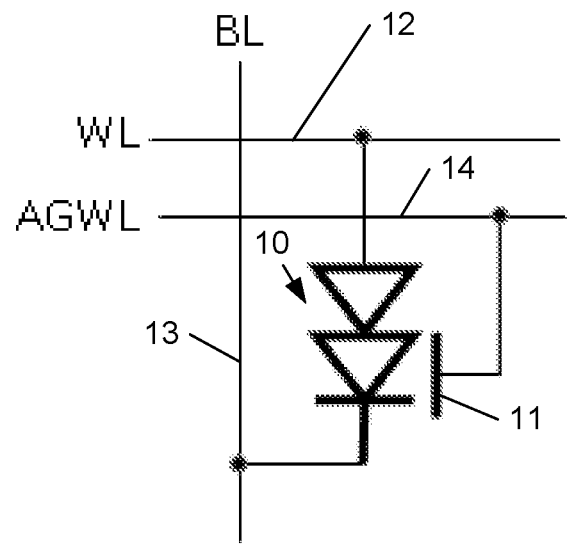
FIG. 1A shows a circuit representation of a NPN-base gated thyristor bit cell.
Figure 1B:
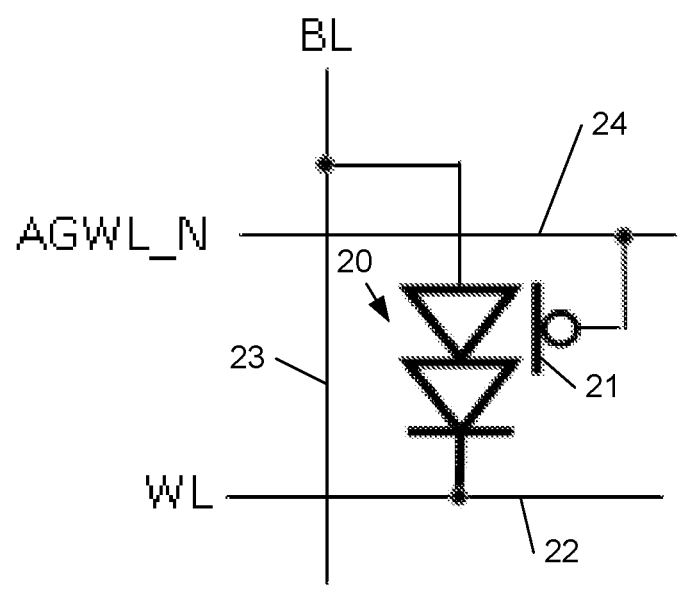
FIG. 1B shows a circuit representation of a PNP-base gated thyristor bit cell.
Figure 2A:
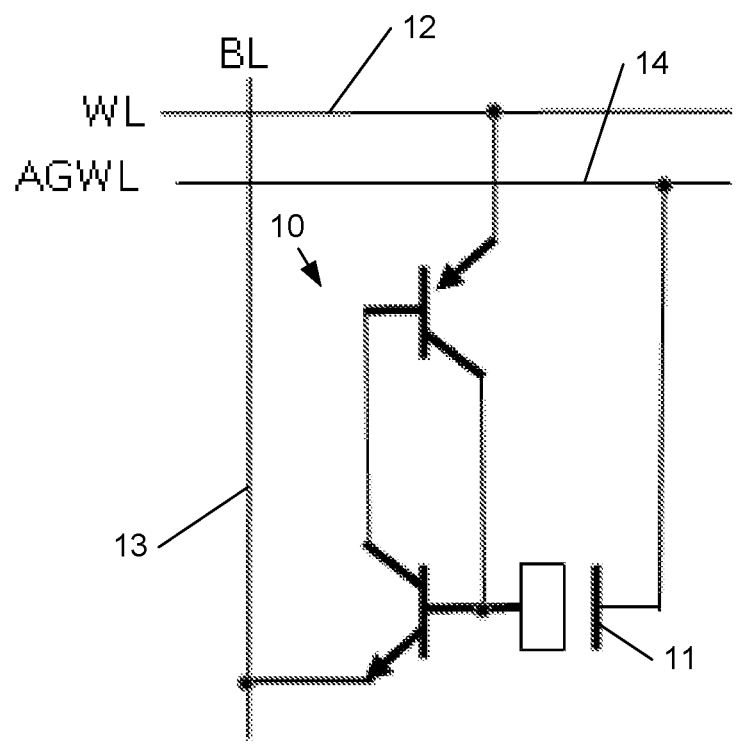
FIG. 2A shows another circuit schematic representation for the NPN-base gated thyristor bit cell of FIG. 1A.
Figure 2B:
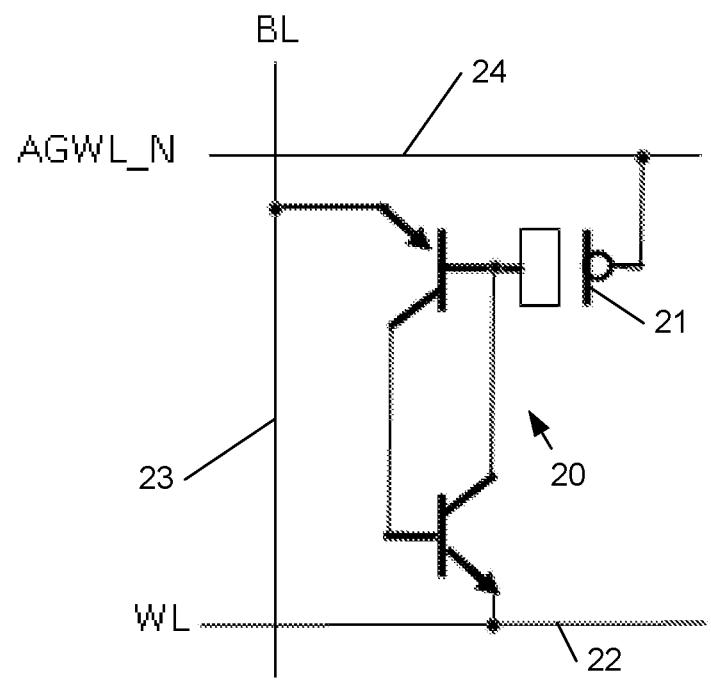
FIG. 2B shows another circuit schematic representation for the PNP-base gated thyristor bit cell of FIG. 1B.

This invention relates to cross-point thyristor memory cells with MOS assist gates, which enhance the operation of the thyristor memory cells. FIG. 1A and FIG. 1B show in one circuit representation two types of cross-point thyristor memory cell array configurations. Here the thyristor memory cells 10 and 20 are represented by serially connected diodes. Another schematic circuit representation of the thyristor memory cell configurations of FIGS. 1A and 1B is shown in FIG. 2A and FIG. 2B respectively. In FIGS. 2A and 2B the memory cells 10 and 20 are represented by PNP and NPN bipolar transistors in which base of the PNP transistor also forms the collector of the NPN transistor and the collector of the PNP transistor also forms the base of the NPN transistor. Physically a thyristor may be considered as four semiconductor regions of alternating P and N polarities. The P region at an end of the four regions is considered the anode of the thyristor and the N region at the opposite end of the four regions is considered the cathode. The two intermediate regions of P and N polarities between the anode and cathode are termed the base regions of the thyristor.

FIGS. 1A, B and 2A, B also show how the thyristor memory cells 10 and 20 might be connected in a memory array. In FIGS. 1A and 2A, a word line (WL) 12 of a memory array is connected to the anode of the thyristor memory cell 10 and a bit line (BL) 13 of the memory array is connected to the cathode of the thyristor memory cell 10 to form a cross-point connection to the thyristor memory cell 10. An assist gate word line (AGWL) 14 of the memory array is connected to the assist gate 11 at the base of NPN transistor. The assist gate 11 is capacitively coupled to the base of the NPN transistor of the thyristor cell and may be viewed as the gate of an MOS transistor formed by the base as the channel region between the source and drain regions (the cathode and N base region of the thyristor) of the MOS transistor. In FIGS. 1B and 2B, a word line (WL) 22 of a memory array is connected to the cathode of the thyristor memory cell 20 and a bit line (BL) 23 of the memory array is connected to the anode of the thyristor memory cell 20. An assist gate word line (AGWL) 24 is connected to the assist gate 21 at the base of PNP transistor.

Figure 3A:
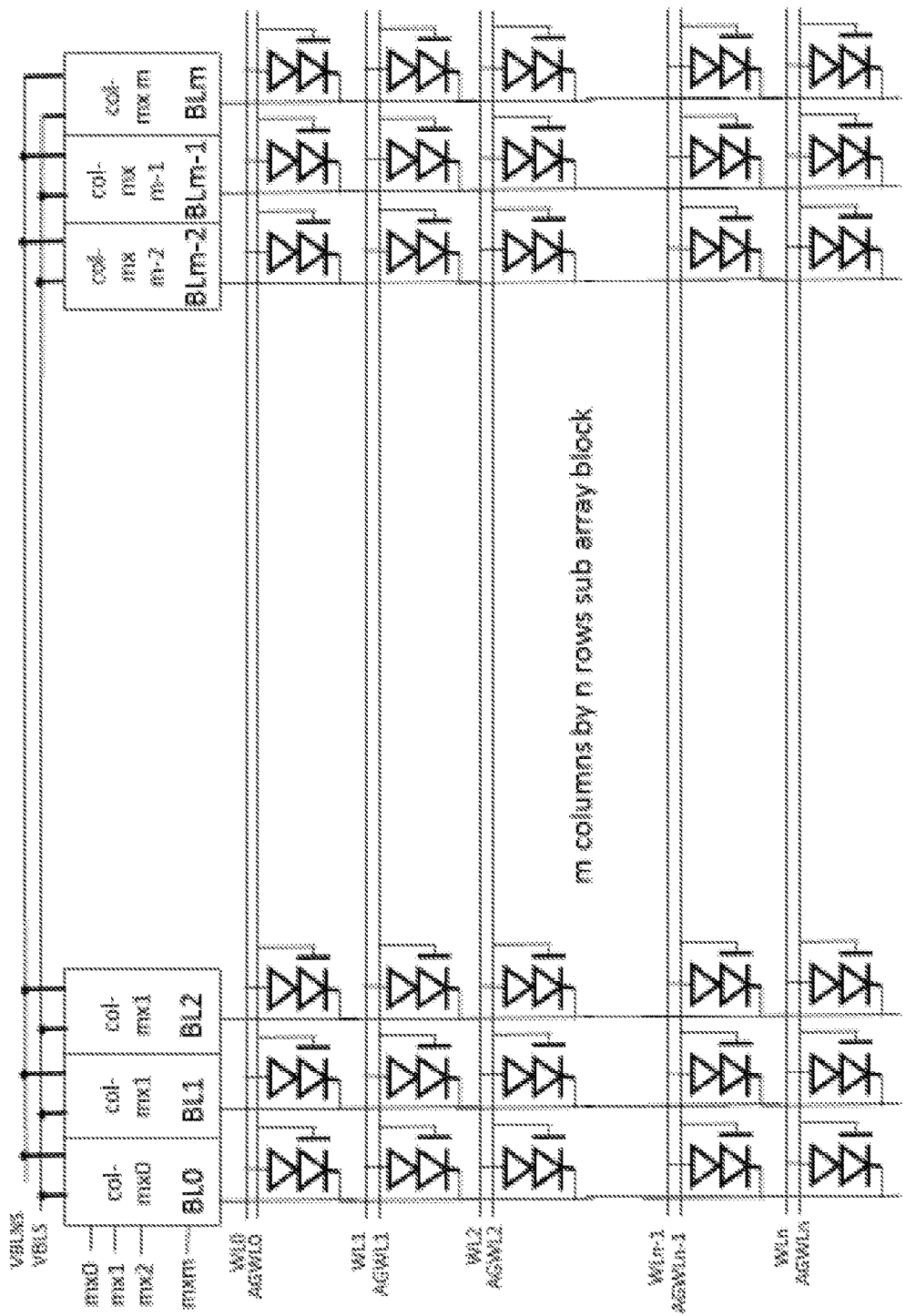
FIG. 3A shows a cross-point memory array of NPN-base assist gate thyristor bit cells of FIGS. 1A and 2A.

One arrangement for an array of NPN-base gated thyristor bit cells is shown in FIG. 3A. The WL (Word Line) connects a row of bit cells at the thyristor anode, and the BL (Bit Line) connects one column of bit cells at the thyristor cathode of the memory cells. An assist gate word line (AGWL) connects a row of NPN-base gated thyristor bit cells at the assist gate of each cell. The BLs connecting the selected bit cells for an operation are the selected BLs and the WL connecting the selected bit cells for that operation is the selected WL. The bit cells not connected to selected BLs nor the selected WL are unselected bit cells. The bit cells connecting to selected BLs but not to selected WL are half selected cells with column selected. The bit cells connecting to the selected WL but not to the selected BLs are also called half-selected bit cells. In this case they are half-selected bit cells with row selected.

In passing, it should be noted that word and bit lines are used in the sense that the bit lines carry the data to and from the memory cells and the word lines allow the memory cell in the array to be selected accessed. Row and column indicate the perpendicular orientation of the word and bit lines to each other but not to an absolute orientation of word and bit lines in space.

Figure 3B:
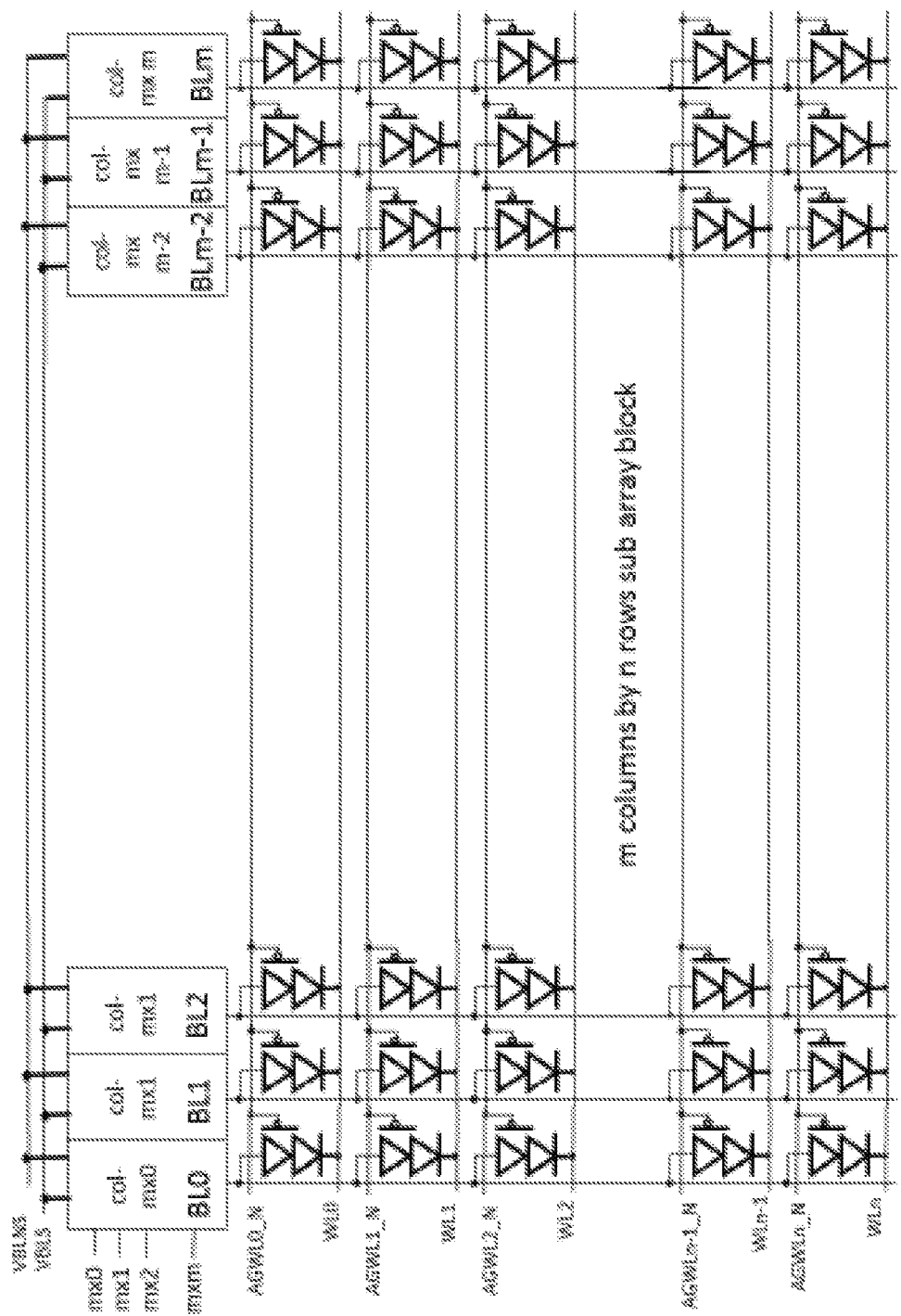
FIG. 3B shows a cross-point memory array of PNP-base assist gate thyristor bit cells of FIGS. 1B and 2B.

An alternate arrangement of a bit cell array with PNP-base thyristor memory cells is shown in FIG. 3B. Bit line BLs connect the thyristor anodes and word line WLs connect the thyristor cathodes of the PNP-base thyristor memory cells as shown in FIG. 3B. An assist gate word line (AGWL) connects a row of PNP-base gated thyristor bit cells at the assist gate of each cell. The methods of operation described below are applicable to both FIGS. 3A and 3B arrangements. The description below is based on the FIG. 3A arrangement with MOS assist gate placed at the base of NPN transistor of the thyristor cell.

Because the cross-point thyristor memory cells in the array are not completely isolated electrically from each other, measures must be taken to access the selected bit cells for proper read and write operations without unwanted disturbance to the unselected cells. In this cross-point thyristor memory cell array the WL connects directly to cathode of all bit cells in entire row and the BL connects directly to anode of all bit cells in entire column. Also, the assist gate connects directly to the assist gate of all bit cells in the same row. The switching of WL, BL, and assist gate for accessing selected bit cells unavoidably disturbs half-selected and some unselected bit cells adjacent to selected bit cells. Innovative operational methods are described which overcome disturbance issues.

In the described operations the crosspoint thyristor array with MOS assist gates are operated in a fixed sequence of operations from standby mode. The operations are read, write data_0, write data_1, recovery, and back to standby or "rest" mode. In particular, the write data_0 and then the write data_1 operations are performed in the write data operation, as shown in FIG. 4A.

By convention, data_0 stored in a thyristor memory cell places the cell in an ON state, and data_1 stored in the cell places the cell in an OFF state. To determine the data in the memory cells, a read operation reads the data in bit cells, typically from a plurality of selected cells in a selected row. The read data can be stored inside a latch for a write-back operation if write-back is desired. To place data into the memory cells, a write operation is performed. The write operation is separated into two steps. The first step is to write data_0 cells and the second step is to write data_1 cells. When it is in data_0 writing step, the data_1 bits are in unselected state (half selected state precisely). When it is in data_1 writing step, the data_0 bits are in unselected state ((half selected state precisely). Before the selected row of bit cells go into standby or unselected state, the selected row of bit cells go into recovery step. After the recovery step the row of bit cells are into standby mode. The write data_0 and data_1 sequences can be altered. The writing data_1 can be in first step and the writing data_0 can be in second step, although all the descriptions below are based on first writing data_0 and writing data_1 in second step.

Figure 4A:
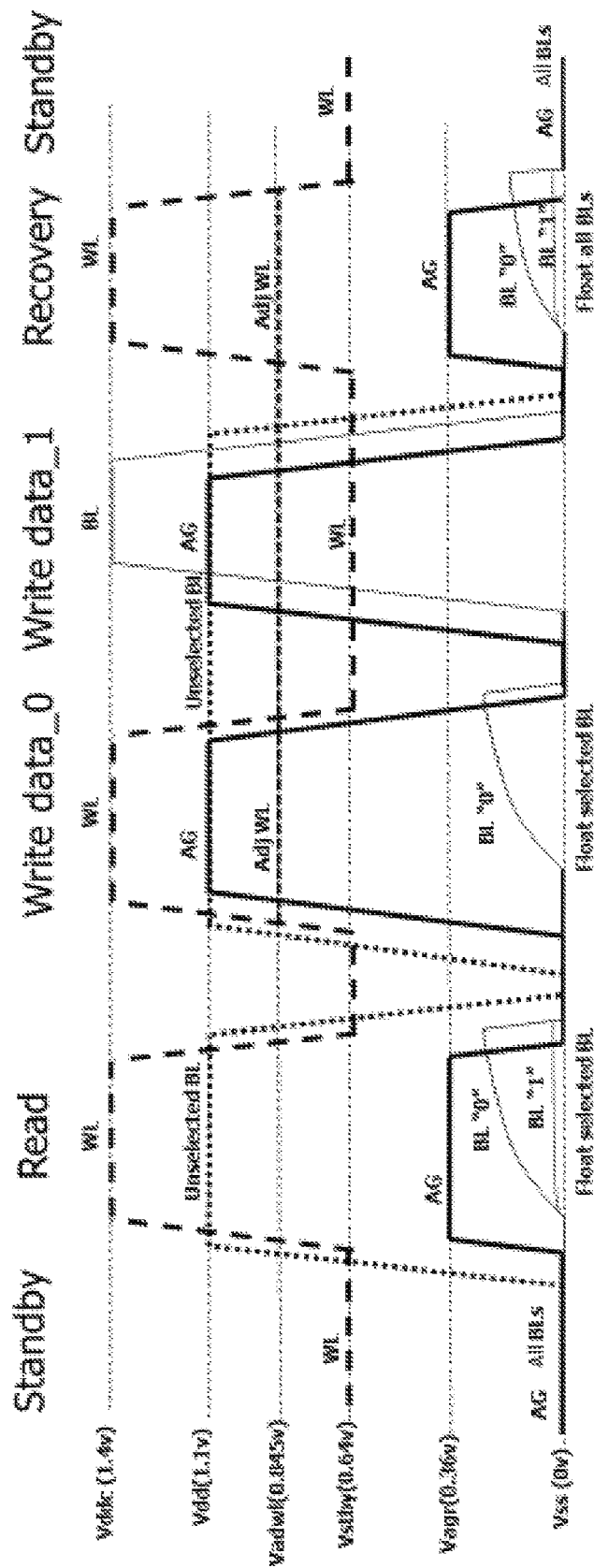
FIG. 4A shows operation modes, voltage waveforms and timing for the cross-point memory array of FIG. 3A according to an embodiment of the invention.
Figure 4B:
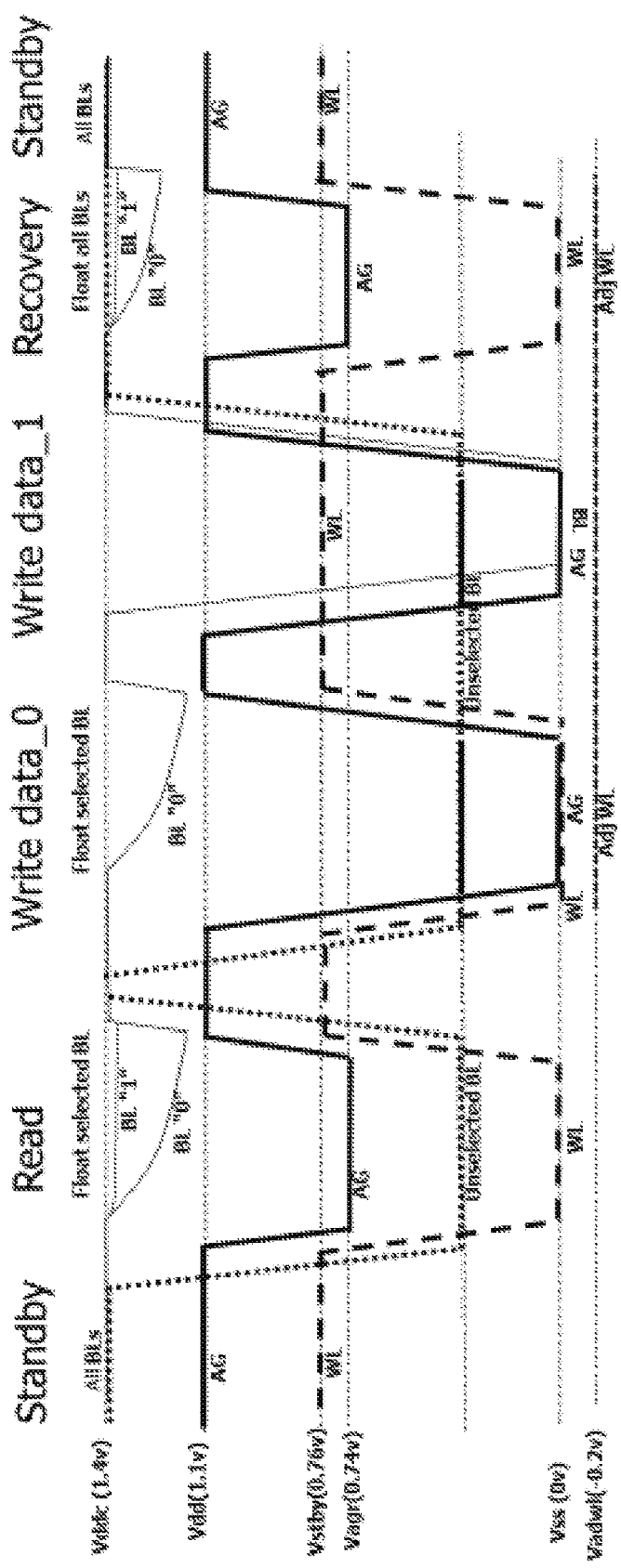
FIG. 4B shows operation modes, voltage waveforms and timing for the cross-point thyristor memory array of FIG. 3B according to an embodiment of the invention.

The descriptions below are based on NPN-based thyristor memory cell array, and they can be easily adapted to PNP-base thyristor memory cell array by converting voltage levels for MOS assist gate level, BLs, and WLS as shown in FIG. 4B. In this arrangement the MOS assist gate is controlled with a falling pulse, while in NPN-base thyristor array shown in FIG. 3A the MOS assist gate is controlled with a rising pulse.

Returning to the waveforms of FIG. 4A and the corresponding NPN-based thyristor memory cell array of FIG.

3A, in standby mode all WLs are at Vstdby level (0.64V) which is high enough to maintain the data_0 bit cells in the ON state and not high enough to turn the data_1 cells into data_0 cells. The BLs are at ground level (0V). The assist gates (AG) are also at ground level (0V).

For write operations, all bit cells in unselected rows are also at standby levels except for bit cells in rows which are adjacent to a row selected. During operations, the adjacent rows are biased at a slightly higher WL level to avoid disturbance to the ON bit cells in the adjacent rows from activities in the selected row. This adjacent WL bias level (0.84V) raises the bit cell ON standby current in the adjacent rows from below sub-picoampere to about a nanoampere. The voltage on the adjacent row WLs is raised before write operations are engaged in the selected row. The adjacent row WLs can also be raised for read and recovery operations but the voltage raising may be eliminated if the disturbance is no danger to the stored data_0 (ON) in the adjacent row bit cells. In FIG. 4A the adjacent row WL is raised for the recovery operation but not for the read operation.

For the read operation shown in FIG. 4A, the unselected BLs are then raised up (1.1V) for BL de-biasing purposes, as described in U.S. Pat. No. 9,842,639, which issued Dec. 12, 2017 to the present inventor and entitled, "Systems and Methods for Managing Read Voltages in a Cross-Point Memory Array." The selected BLs are set into high impedance mode and allowed to float at ground (0V). The WLs are pulled up high (1.4V) to a level to provide a sufficient V (thyristor anode-to-cathode voltage) for the read operation for the selected thyristor memory cells. The unselected memory cells are subject to a low $V_{AK}$ (1.4V–1.1V).

The assist gate swings from 0V to Vagr. The Vagr (0.36V) voltage swing helps speed the reading of the selected thyristor memory cells. This is important for operating the thyristor memory cells in low voltage. The assist gate MOS capacitor coupling boosts the speed of the thyristor read operation and is critical for low voltage thyristor operations. With the assist gate voltage raised, the selected thyristor memory cell is turned on strongly to charge up BL if the selected bit cell is in the ON state. This is shown by the dotted rising line labeled "BL "0"" in FIG. 4A. The BL is not be charged if the selected bit cell is in OFF state, though the BL voltage is slightly raised from BL leakages as shown by dotted line labeled "BL "1"". The BL level can then be sensed to drive output data_0 or data_1. The sensed data can be latched, and all the read and write operations can be performed from or to these latches. The data stored inside the latches are written back into the bit cells when the selected WL is being closed. Since all the intermediate read and write operations start or stop at the latches instead of the bit cells, this write back operation method can eliminate unnecessary activities and save significant power. This write back operation can be eliminated or altered if power is not critical.

As stated earlier, the write operations start with writing data_0 as shown in FIG. 4A. The unselected BLs are first raised to de-bias write BL level (1.1V) for protecting the thyristor data. The protection is mainly for the half-selected bit cells in the selected row, i.e., the unselected memory cells of the selected row. These half-selected bit cells receive same assist gate coupling voltage as the selected bit cells, and their NPN base (see FIG. 2A) voltage is raised by coupling as the assist gate voltage rises. The de-bias write BL level is high enough so that the NPN base level of these half-selected bit cells in the selected row does not turn on the NPN base-emitter junction.

The selected WL is then raised to provide a sufficient positive $V_{AK}$ voltage for turning on the selected thyristor memory cell (write data_0). The selected BLs are pre-charged to Vss or 0V, or to a high impedance state. The BLs can be left at 0V for designs in which power is not an issue and the voltage drop along the WL line is not an issue. The assist gate is raised up (1.1V) to turn on the selected bit cells more quickly. The rising assist gate couples with the NPN base of the thyristor memory cell to trigger the thyristor latching up into the ON state. Once the thyristor memory cell is in the ON state the assist gate voltage is lowered back to 0V. Since the thyristor is ON strongly at this moment, the coupling effects from the falling assist gate voltage do not affect the thyristor ON state. The WL is then lowered down back to standby WL level (0.64V) and the selected BLs are pre-charged back to 0V. The unselected BLs can remain at the de-bias write BL level for next write data_1 step, or they can be pre-charged back to 0V and perform a separate write data_1 de-bias operation.

In FIG. 4A for writing data_1 the unselected BLs are raised to the de-bias write BL level (1.1V) as stated immediately above. The WLs, including the selected WL remain at standby WL level (0.64V). The selected BLs for writing data_1 are raised to de-bias voltage 1.4V to provide a sufficient negative $V_{AK}$ voltage (0.64V–1.4V) for ensuring the turning off of the selected thyristor memory cell (write data_1). The assist gate AG of the selected row is raised up sufficiently high (1.1V) first before the selected BLs are raised, and then is lowered down to shut off the thyristors. The de-biased BLs are pre-charged back to 0V to complete the write data_1 operation.

Not shown clearly in the timing diagram of FIG. 4A is that for the selected BLs, the BLs to be written with data_1 are driven to the BL de-bias voltage (1.1V) during write_0 (writing data_0) step in a similar manor as the unselected BLs. These BLs then are pre-charged back to 0V for next write_1 (writing data_1) operation. Similarly, the selected BLs written with data_0 are driven to BL de-bias voltage (1.1V) before the write_1 operation and pre-charged back to 0V after write_1 in similar manor as unselected BLs.

For the unselected bit cells in the selected row to preserve their stored data, their BLs are driven to the de-bias voltage (1.1V) which is sufficiently high so as not to turn on the NPN base-emitter junction of the thyristor bit cell when the rising assist gate voltage couples to the NPN base. The write_0 and write_1 operations have higher assist gate swings, and the unselected BL de-bias voltage (1.1V) is important in preserving the data in these unselected bit cells. The NPN base can be coupled with the assist gate with impunity. After the assist gate voltage completes its toggling up and down and rests back to its original 0V level, the NPN base also rests back to the original level. This helps acceptably preserve the data stored in the unselected memory cells. Though the On state of data_0 bit cells become weaker after the assist gate toggles up and down, because the base of PNP transistor is charged up from NPN base shown in FIG. 2A, the NPN base falls back to the original level after the assist gate voltage toggling. The following recovery operation then fully recovers the data_0 state.

To push a memory cell in an OFF state to a deeper OFF state, the selected BL level may be raised and/or the selected WL may be lowered during the write_1 operation. The drawbacks are the increased magnitudes of the voltage swings and extra circuitry for the increased voltages.

The recovery operation, the last operation before returning to the standby mode, follows after the write operations. The recovery operation recovers the ON bit cells in the entire selected row. As shown in FIG. 4A all BLs are precharged to 0V and the selected WL is raised high (1.4V) to trigger the memory cell ON thyristors into definite ON states with the help of the assist gate. The assist gate is raised to Vagr (0.36V) to turn all thyristors with data_0 into strongly ON states. The assist gate voltage swing can be the same as in the read operation, or it can be separately optimized for the recovery operation. In FIG. 4A the same voltage swing is used for simplicity. However, it should be noted that the assist gate swing Vagr is not high enough to turn OFF bit cells into ON states. Once a definite ON state is achieved for every ON bit cell, the assist gate is lowered back to 0V, and the WL is lowered back to the standby WL level (0.64V) and the BLs are precharged back to 0V. All these selected bit cells are now back in standby mode.

The data_1 in the OFF bit cells are maintained after the operations. The voltage changes of the assist gates, WLs, and BLs result in effective coupling to push the half-selected or unselected bit cells toward more certain OFF states. If the bit cells are in ON states and are biased with sufficient latching current, the bit cells can resist coupling into OFF states. Or, if the bit cells are biased with enough positive $V_{AK}$, the coupling or disturbance can push the bit cells into more certain ON states as in the read or recovery operations. The data_0 in the ON bit cells are maintained either with higher $V_{AK}$ for having enough latching power to resist any disturbance or the ON bit cells use the recovery step in which the bit cells are triggered to be in deeper latching states. In this way the data_0 cells which are weakened by disturbance can fully recover back to definite data_0 states before completion of operations before entry into the standby mode. The recovery operation covers entire selected row. All the ON bit cells in the row are recovered. The current flowing in these ON bit cells must be sufficient to drive the bit cell to a certain latching state—about a sub-nanoampere current is effective.

Similar descriptions can be made with respect to operations for memory cell arrays with the MOS Assist gate on PNP base as shown in FIGS. 1B, 2B, 3B, and 4B. The cycle is the same as that of FIG. 4A, i.e., standby mode, data_0, write_1 and recovery operations. The waveforms are the same except that the polarities are reversed reflecting the reversed connections of the memory cells of FIG. 3B compared to those of FIG. 3A.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method of operating an array of thyristor memory cells, each thyristor memory cell having an anode, a cathode, first and second base regions, the array having a plurality of first lines in a first direction, each first line connected to the anodes or cathodes of a plurality of thyristor memory cells aligned in the first direction, a plurality of second lines in a second direction perpendicular to the first direction, each second line connected to the cathodes or anodes of a plurality of thyristor memory cells aligned in the second direction, a plurality of third lines in the first direction, each third line capacitively coupled to one of the base regions of thyristor memory cells aligned in the first direction, the method comprising:

in a standby mode, holding the plurality of first lines at a first voltage and holding the plurality of second lines at a second voltage, the difference in voltage between the first and second voltages sufficient to maintain ON thyristor memory cells in that state but insufficient to turn ON the OFF thyristor memory cells; and for a write operation, engaging one or more thyristor memory cells by a first line selected from the plurality of first lines and one or more second lines selected from the plurality of second lines, driving to a third voltage a subset of first lines connected to thyristor memory cells which are adjacent to the thyristor memory cells connected to the selected first line, the third voltage creating a greater difference with respect to the second voltage than the first voltage so that ON thyristor memory cells connected to the subset of first lines are undisturbed by the write operation.

2. The method of claim 1 wherein the step of driving to a third voltage the subset of first lines connected to thyristor memory cells which are adjacent to the thyristor memory cells connected to the selected first line is performed before engaging one or more thyristor memory cells by a selected first line and one or more selected second lines in the write operation.

3. The method of claim 1 wherein the third voltage increases the voltage through the unselected ON thyristor memory cells from below sub-picoampere to about a nano-ampere.

4. The method of claim 1 wherein the write operation comprises engaging the one or more thyristor memory cells by the selected first line and one or more selected second lines to turning ON the one or more thyristor memory cells.

5. The method of claim 1 wherein the write operation comprises engaging the one or more thyristor memory cells by the selected first line and one or more selected second lines to turning OFF the one or more thyristor memory cells.

6. The method of claim 1 wherein the plurality of first lines comprise word lines connected to anodes of the thyristor memory cells, the plurality of second lines comprise bit lines connected to cathodes of the thyristor memory cells, and the plurality of third lines capacitively coupled to P base regions of the thyristor memory cells.

7. The method of claim 1 wherein the plurality of first lines comprise word lines connected to cathodes of the thyristor memory cells, the plurality of second lines comprise bit lines connected to anodes of the thyristor memory cells, and the plurality of third lines capacitively coupled to N base regions of the thyristor memory cells.

8. A method of operating an array of thyristor memory cells, each thyristor memory cell having an anode, a cathode, first and second base regions, the array having a plurality of first lines in a first direction, each first line connected to anodes or cathodes of a plurality of thyristor memory cell aligned in the first direction, a plurality of second lines in a second direction perpendicular to the first direction, each second line connected to cathodes or anodes of thyristor memory cells aligned in the second direction, a plurality of third lines in the first direction, each third line capacitively coupled to one of the base regions of thyristor memory cells aligned in the first direction, the method comprising:

turning ON a first set of one or more selected thyristor memory cells and/or turning OFF a second set of one or more selected thyristor memory cells, the selected thyristor memory cells connected to a selected first line and the first and second sets of selected one or more thyristor memory cells connected to one or more selected second lines;

then driving all the second lines to a second voltage, driving the selected first line to a first voltage and allowing the second lines to float, and driving a selected third line capacitively coupled to the thyristor memory cells connected to the selected first line to a third voltage, a difference between the third and second voltages sufficient to maintain ON thyristor memory cells connected to the selected first line in ON states but insufficient to turn ON the OFF thyristor memory cells connected to the selected first line and a difference between the first and second voltages sufficient to drive the ON thyristor memory cells into deeper ON states with the third voltage on the selected third line.

9. The method of claim 8 further comprising:
driving the selected third line to the second voltage, returning the first selected line to a standby voltage and driving all the second lines to the second voltage;
whereby the thyristor memory cells of the array are placed in a standby mode.

10. The method of claim 8 wherein the differences between the third and second voltages, and the first and second voltages are sufficient to drive a sub-nanoampere current through the ON thyristor memory cells.

11. The method of claim 8 wherein the plurality of first lines comprise word lines connected to anodes of the thyristor memory cells, the plurality of second lines comprise bit lines connected to cathodes of the thyristor memory cells, and the plurality of third lines capacitively coupled to P base regions of the thyristor memory cells.

12. The method of claim 8 wherein the plurality of first lines comprise word lines connected to cathodes of the thyristor memory cells, the plurality of second lines comprise bit lines connected to anodes of the thyristor memory cells, and the plurality of third lines capacitively coupled to N base regions of the thyristor memory cells.

13. The method of claim 8 further comprising:
driving a subset of first lines connected to thyristor memory cells which are adjacent to the thyristor memory cells connected to the selected first line to a fourth voltage, the fourth voltage creating a greater difference with respect to the second voltage than the first voltage so that ON thyristor memory cells connected to the subset of first lines are undisturbed by the performance of a recover operation.

* * * * *